United States Patent
Phan et al.

(10) Patent No.: US 7,001,830 B2
(45) Date of Patent: Feb. 21, 2006

(54) SYSTEM AND METHOD OF PATTERN RECOGNITION AND METROLOGY STRUCTURE FOR AN X-INITIATIVE LAYOUT DESIGN

(75) Inventors: Khoi A. Phan, San Jose, CA (US); Bharath Rangarajan, Sunnyvale, CA (US); Bhanwar Singh, Morgan Hill, CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 115 days.

(21) Appl. No.: 10/653,309

(22) Filed: Sep. 2, 2003

(65) Prior Publication Data

US 2005/0048741 A1 Mar. 3, 2005

(51) Int. Cl.
*H01L 21/20* (2006.01)
*H01L 21/36* (2006.01)

(52) U.S. Cl. .................. 438/482; 438/975; 356/150
(58) Field of Classification Search ............... 438/462, 438/599, 617, 975; 356/150, 399, 400, 401
See application file for complete search history.

(56) References Cited

U.S. PATENT DOCUMENTS

| | | | |
|---|---|---|---|
| 3,861,798 A | | 1/1975 | Kobayashi et al. |
| 4,657,379 A | * | 4/1987 | Suwa ..................... 355/53 |
| 5,049,925 A | | 9/1991 | Aiton et al. |
| 6,084,679 A | | 7/2000 | Steffan et al. |
| 6,269,322 B1 | | 7/2001 | Templeton et al. |
| 6,342,735 B1 | | 1/2002 | Colleli et al. |
| 6,728,008 B1 | * | 4/2004 | Kamisuwa ................. 358/474 |

FOREIGN PATENT DOCUMENTS

WO    WO 01/09927 A    2/2001

OTHER PUBLICATIONS

C. Angioni "International Search Report", Feb. 9, 2005, HV Rijswijk, Netherlands.
Bob Dean, et al., "DEsign-to-process integration: optimizing 130 nanometer X Architecture manufacturing" Proceedings of SPIE, vol. 5042, Jul. 2003, pp. 197–204.
Canon Inc. Patent Abstracts of Japan vol. 11, No. 346 (E–556), Nov. 12, 1987.
Fujitsu Ltd. Patent Abstracts of Japan vol. 17, No. 272 (E–1371), May 26, 1993.

* cited by examiner

*Primary Examiner*—Phuc T. Dang
(74) *Attorney, Agent, or Firm*—Amin & Turocy, LLP

(57) ABSTRACT

The present invention relates to inspection methods and systems utilized to provide a best means for inspection of a wafer. The methods and systems include wafer-to-reticle alignment, layer-to-layer alignment and wafer surface feature inspection. The wafer-to-reticle alignment is improved by the addition of diagonal lines to existing alignment marks to decrease the intersection size and corresponding area that a desired point can reside. Layer-to-layer alignment is improved in a similar manner by the addition of oblique and/or non-linear line segments to existing overlay targets. Also, providing for wafer surface inspection in a multitude of desired diagonal axes allows for more accurate feature measurement.

25 Claims, 11 Drawing Sheets

SYSTEM AND METHOD OF PATTERN RECOGNITION AND METROLOGY STRUCTURE FOR AN X-INITIATIVE LAYOUT DESIGN

TECHNICAL FIELD

The present invention generally relates to semiconductor processing, and in particular to improving wafer fabrication inspection by utilizing diagonal (45 degrees) lines in addition to traditional perpendicular lines of inspection, to manufacture improved semiconductor designs.

BACKGROUND

In the semiconductor industry, there is a continuing trend toward higher device densities. To achieve these high densities, there has been and continues to be efforts toward scaling down device dimensions (e.g., at submicron levels) on semiconductor wafers. In order to accomplish such high device packing density, smaller and smaller feature sizes are required in integrated circuits (ICs) fabricated on small rectangular portions of the wafer, commonly known as dies. This can include width and spacing of interconnecting lines, spacing and diameter of contact holes, surface geometry such as corners and edges of various features as well as surface geometry of other features. To scale down device dimensions, more precise control of fabrication processes are required. The dimensions of and between features can be referred to as critical dimensions (CDs). Reducing CDs, and reproducing more accurate CDs facilitates achieving higher device densities through scaled down device dimensions and increased packing densities.

The process of manufacturing semiconductors or ICs typically includes numerous steps (e.g., exposing, baking, developing), during which hundreds of copies of an integrated circuit may be formed on a single wafer, and more particularly on each die of a wafer. In many of these steps, material is overlayed or removed from existing layers at specific locations to form desired elements of the integrated circuit. Generally, the manufacturing process involves creating several patterned layers on and into a substrate that ultimately forms the complete integrated circuit. This layering process creates electrically active regions in and on the semiconductor wafer surface.

The accuracy with which an image can be positioned on the surface of a wafer is quantified utilizing a minimum registration tolerance. The registration tolerance is based in large part upon the uncertainty that exists in overlaying a second masking level over a first masking level. The inability to perfectly overlay two layers may be due to several factors such as the mask making equipment, temperature differences between times of exposure that can cause mask expansion or contraction and limitations on the registration capability of the alignment tool.

Alignment accuracy and overly accuracy both provide information about the maximum error that will exist between the position of a level one pattern and a position of a level two image (which is desired to be exactly superimposed on the level one pattern. Alignment accuracy specifies the location of the alignment marks. Once it has been determined that the wafer has been aligned with a reticle as well as possible, the alignment error in the position between the two levels is determined by the inaccuracies of the stepper's alignment system.

In contrast, overlay accuracy refers to the error in position between the reticle image and the pattern on the wafer at any point on the wafer, not just where the alignment marks are made. Significant overlay errors can exist even if alignment is perfect due to errors that can exist outside of the alignment system such as lens distortions, chuck induced wafer distortions and errors in the placement of the image on a reticle.

Since all of the features on a circuit must overlay each other to within accepted tolerances, the actual overlay error of a lithography process will determine the yield and performance of the fabricated chips. If the total overlay error exceeds the tolerance that was designed into the dimensions of the chip pattern, yield will be reduced.

Alignment of one pattern layer to a previous layer is done with the assistance of special alignment patterns created on both the wafer and each reticle pattern. The procedure of aligning the reticle pattern to previously created features on the wafer involves moving the wafer stage until the reticle alignment marks coincide with the alignment marks in the wafer. Once this is accomplished, it is assumed that the circuit patterns on the reticle are correctly aligned to the features previously fabricated on the wafer (within the allowed overlay tolerance).

Overlay error is defined as the planar distance from the center of the overlay target on the wafer level in "level N" to the center of the image of the overlay target in the resist in "level N+1." Alignment and overlay errors in semiconductor technology are expressed in terms of their x and y components. Thus, if a histogram is made of the x-axis overlay error at many points across the wafer, the result will be roughly a Gaussian distribution of overlay errors. The number quoted as the x-axis overlay (or alignment error) is the absolute value of the mean error plus three times the standard deviation of the distribution about the mean. That is, the x-axis overlay error, Overlay$_x$, would be expressed as: Overlay$_x$=($|X|+3\sigma_x$). The y-axis overlay and alignment errors are described using the same form.

The impetus to reduce total overlay error is that if a smaller overlay error can be achieved, one can use tighter tolerances for designing circuit patterns For example, a smaller metal pitch can be used, which in many cases is an important determinant in device die size. Die size in turn is a major factor in the overall cost of producing a given circuit, since die size indicates how many parts can be made on each wafer. If the design rules do not make sufficient allowance for the overlay error, then a high percentage of the devices may fail. Overlay errors vary from one stepper to another, and wafers on a process line may be processed interchangeably on any of the steppers. This means that the tolerance inherent in the design rules must take into account the envelope of performance for all the steppers in a given fabrication.

The total process overlay budget includes all sources of error found in the lithography process, including stepper stage and lens variations, resist applications and develop variations, wafer non-uniformities, and measurement errors. The task of the overlay measurement tool is to quantify the magnitude of error arising from each of the sources and to verify the reduction of this error as process improvement develops.

There are two main functions of the overlay measurement in the fabrication of ICs. The first is to monitor the performance of lithographic alignment procedure. To do this wafers are sampled from each lot to statistically assess the overlay performance of the lot. The second function of overlay measurements is to assist in the setup of the lithography process. Overlay measurements help optimize the stepper systems when they are initially installed, and they are later used to maintain optimal stepper performance by evaluating overlay on a periodic basis.

Overlay is measured by simply printing one pattern on one level and a second pattern on a consecutive level, then measuring (on a stand-alone metrology system), the difference in the position, orientation and distortion of the two patterns. If both patterns are printed on the same exposure tool the result is tool-to-itself overlay. If they are printed on two different exposure tools the result is tool-to-tool overlay.

Alignment marks are typically specific to the stepper that is employed to perform a lithography process. Simple cross patterns were often used in earlier IC processes, but now the marks typically resemble grating patterns, with structures extending in orthogonal x and y directions.

A number of alignment strategies have been utilized in an attempt to bring the patterns on the wafer of each exposure field into satisfactory alignment with the pattern on the reticle. One method is two-point global alignment which employs two marks, spaced several inches apart. The alignment of the first mark on the wafer to its corresponding mark on the reticle ensures that the wafer and reticle are aligned to the correct x and y positions. By aligning the second set of marks it is ensured that the wafer and reticle patterns are also aligned at the same rotational angle, θ. After these two alignments are completed, the wafer is "blindstepped" to all of the exposure fields, relying on the precision of the stage movements to bring each exposure field into correct alignment. This strategy can thus be successful only if the stage orthogonality is very good and error between fields is very small and stable over time.

A second alignment strategy is called global mapping alignment. In this method, the stepper acquires the x and y positions of 5 to 10 alignment marks and then it computes a least squares fit to the data. That is, the error of each measurement is averaged out over N measurements, so the net placement error is the error of one alignment divided by the square root of N. Based on the errors computed, corrections to the intrafield and stepping parameters (interfield) of the system are made (e.g. the exposure positions of each site are corrected with reference to the computed data). These corrections are assumed to be stable for the 1 or 2 minutes needed to expose the wafer.

Leading semiconductor device manufacturers continue to shrink feature sizes to 100 nm technology node and beyond. The problem is traditional critical dimension (CD) metrology techniques such as critical-dimension scanning electron microscopy (CD-SEM) and conventional (CCD imaging) optical metrology lack the resolution required to provide accurate data about feature critical dimensions and profile. A significant limitation is that these methods provide only a top-down view of features and provide little or no data about characteristics of the side or bottom of the structure.

As CD requirements are smaller and smaller, what is needed is a system and methodology utilized to facilitate smaller components on a semiconductor chip. In order to increase component density, a more accurate methodology and system can be employed to place components more accurately to decrease errors associated with inaccurate measurement made in multiple axes employing overlay metrology, CD-SEM and defect/film thickness alignment marks.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The present invention provides a system and methodology that facilitates an increase in the accuracy of several aspects of the manufacture of semiconductor chip (chip) fabrication. Inspection processes occur throughout a fabrication cycle of a chip and traditionally employ two axes of inspection to verify that the location of CDs and other features of a chip are accurate. Inaccuracies can cause a decrease in the overall yield since a chip can be inoperable due to a defect. Moreover, with the industry trend toward smaller components and corresponding CDs, precision in fabrication is vitally important.

The present invention provides for diagonal (45 degree) axes of inspection to be employed in association with traditional perpendicular X and Y-axes of inspection at a plurality of disparate stations throughout the manufacturing process. Adding a plurality of diagonal (45 degree) axes of inspection allows for circuit design employing a pervasive use of diagonal wiring to be measured. For example, in order to measure the angle of a feature of a chip in a third axis, values measured from a traditional X and Y-axes of inspection were utilized to indirectly calculate the value of the third axis feature. Utilizing diagonal (45 degree) wiring provides for next-generation semiconductor circuits which follow the design standard under the X-initiative.

Moreover, diagonal (45 degree) measurements can be employed to more accurately determine the location of alignment marks utilized when aligning the reticle to the chip for a lithography process. The diagonal (45 degree) lines of measurement can be used in association with traditional X and Y-axes of inspection wherein the horizontal X-axis is orthogonal to the Y-axis.

The diagonal (45 degree) axes of measurement can be employed at a multitude of measurement locations in concert with a wide array of measurement metrology technologies. For example, the diagonal (45 degree) axes can be utilized in association with an overlay target, a CD-SEM target or for measuring defect and/or film thickness or alignment marks.

Yet another aspect of the present invention employs diagonal (45 degree) lines in association with traditional horizontal and perpendicular lines to facilitate the inspection of overlay accuracy utilizing overlay metrology targets.

Still yet another aspect of the present invention relates employing a multitude of diagonal (45 degree) lines to provide a path to follow for a CD-SEM. The CD-SEM can follow the additional lines to provide a more accurate and/or precise measurement as it relates to one and/or a plurality of semiconductor features. It is to be appreciated that diagonal (45 degree) lines can be used in concert with traditional orthogonal X and Y-axes of measurement.

DETAILED DESCRIPTION

Figure 1:
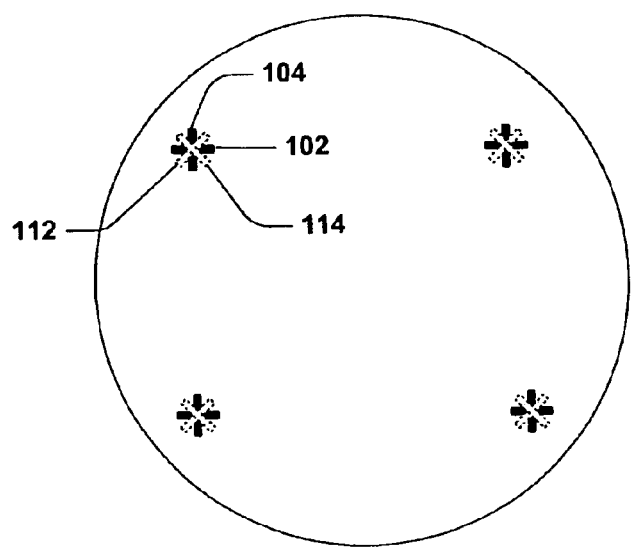
FIG. 1 illustrates traditional alignment marks with two additional lines drawn at 45 degrees from each of the original marks.

FIG. 1 illustrates an embodiment of the subject invention where two diagonal (45 degree) lines 112 and 114 are added to enhance the alignment of a semiconductor employing a design concurrent with the X-initiative. Lines 112 and 114 are utilized in conjunction with a traditional alignment mark drawn with two orthogonal lines 102 and 104 placed on a wafer 100. It is to be appreciated the lines 102, 104, 112 and 114 can be substantially similar in length, width and location relative to each other in all four locations shown.

In this particular embodiment, the two additional lines 112 and 114 lie at 45-degree angles to the original two lines employed for an alignment mark. The two additional lines are added as shown with substantially the same center as the original alignment marks. It should be appreciated that the addition of the two diagonal (45 degree) lines can be placed on at least the reticle and/or the wafer. It is to be understood that the centerline of the additional marks does not have to be substantially the same as the original two alignment marks. If a user desires a feature to have an offset required for manufacturing purposes, the offset may be incorporated into the location of additional oblique, non-linear lines. Further, the marks shown in this particular embodiment are not limited to a 45-degree angle and can be any non-linear (e.g. curved line) or slanted at any angle relative to the original alignment marks given.

By way of example, a circuit following an X-initiative design can employ a pervasive use of diagonal routing of wires in a circuit. By employing diagonal routing in addition to traditional orthogonal routing, wirelength and power consumption can be reduced which corresponds to a reduction in wafer die size and an improvement of signal integrity. Thus, employing diagonal lines in aligning a reticle and wafer allows for proper alignment with an X-initiative circuit design.

Figure 2:
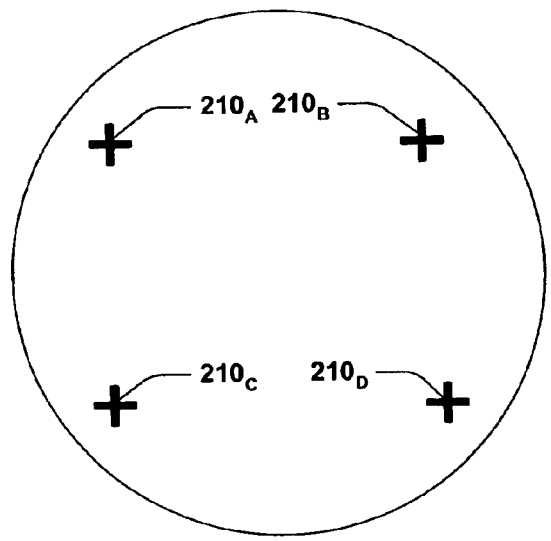
FIG. 2 illustrates prior art showing traditional alignment marks on a semiconductor wafer utilized to align a reticle to the wafer.

Turning briefly to FIG. 2, the prior art shown illustrates a traditional method for placing alignment marks on a semiconductor surface. The traditional method utilizes a plurality of alignment marks each comprised of two lines which intersect and are orthogonal to each other.

FIG. 2 provides an illustration of prior art wherein alignment marks $210_A$–$210_D$ scribed on a surface (e.g. wafer) 200 are utilized to facilitate the alignment of a reticle with the wafer to properly project a pattern onto the surface of the wafer. Traditionally, alignment marks have been made employing two orthogonal lines which intersect to create a desired center point to align the reticle to the wafer. This desired point could be employed to align a reticle and wafer, for example.

Figure 3:
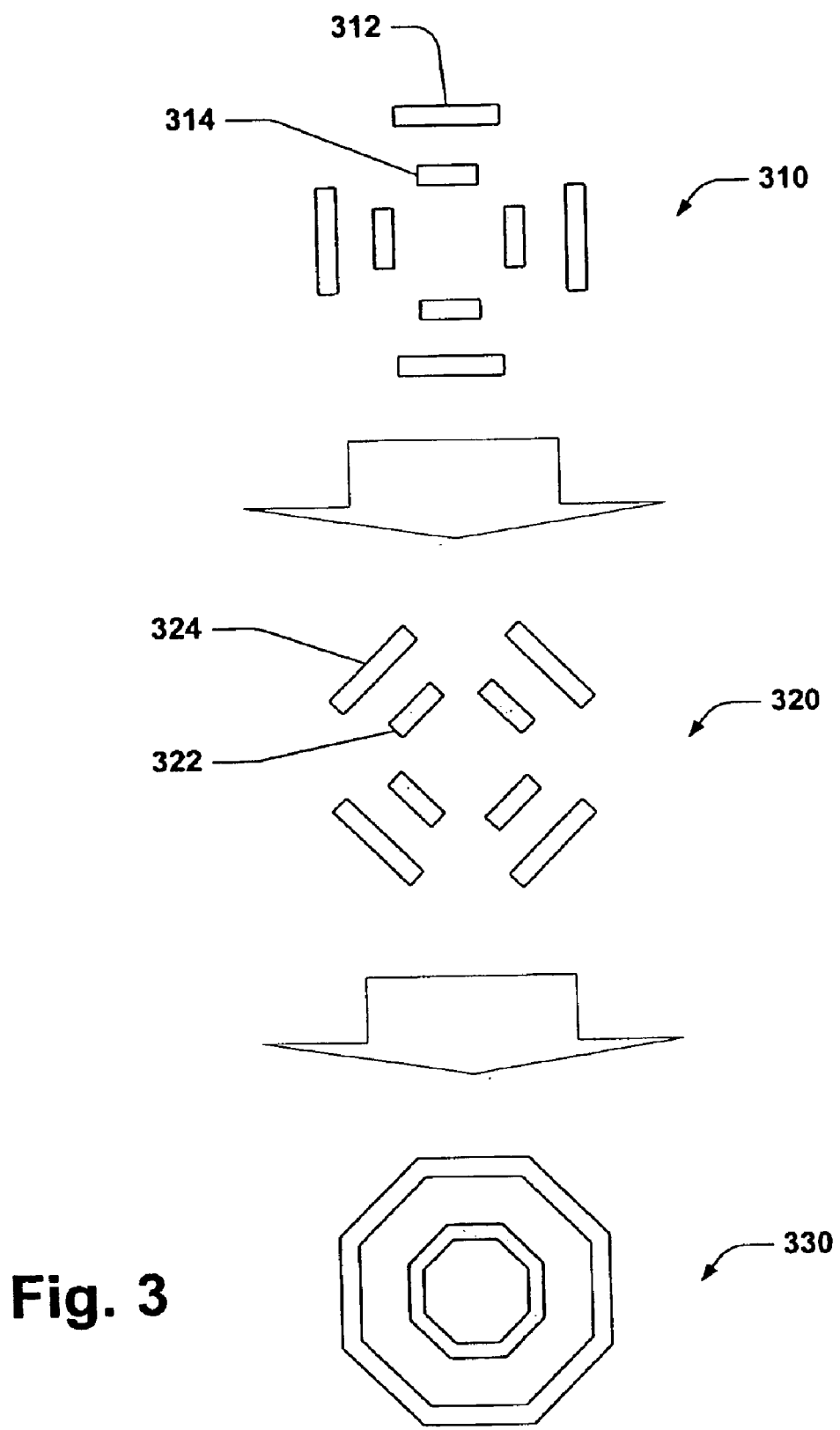
FIG. 3 illustrates a segmented frame-in-frame that employs two axes of inspection coupled together.

FIG. 3 shows a segmented frame target 310 wherein two segmented frames are defined by 312 and 314. Two additional segmented frames 322 and 324 define another segmented frame target 420. The segmented frame 420 is composed of diagonal lines in two additional directions. In this particular embodiment, the additional lines are 45 degrees from the original lines defining the segmented frame target 310.

The initial overlay target provides for a target with lines in a relatively straight horizontal and straight vertical position. The measurement device can follow the segmented frame and determine the center-to-center tolerance allowed. Therefore, the outer and inner frames have a certain location tolerance for their location in space on the wafer. The tolerance of each of the frames individually is utilized to determine the location of the overall location tolerance of the frames (layers) relative to one another.

After the overlay metrology has been performed utilizing a traditional segmented frame-in-frame target 310, the second segmented frame target 320 is employed. The outer frame 324 of segmented frame overlay target 320 has the same area, length and width as outer frame 312. Similarly, inner frame 322 has the same area, length and width as inner frame 314. However, overlay target 320 is rotated 45 degrees relative overlay target 310.

It is to be understood that the X-initiative circuit design would provide for adjacent layers that follow disparate layout methodologies. For example, an integrated circuit design may utilize a traditional layout on layer 3 which requires components and wires to be horizontal and perpendicular to one another. Layer 4, the next adjacent layer, may employ an X architecture wherein all the wires are diagonal (45 degrees) to the wires in layer 3. Therefore, the second overlay target can be employed to determine that the wireways and/or tunnels fabricated in layer 4 are lined up with the wireways and/or tunnels of layer 3.

Overlay target 330 represents a combination of targets 310 and 320. Target 330 can be utilized to ensure that each layer in a fabrication is placed within tolerance relative to the layers adjacent and/or non-adjacent to each other. Target 330 can be employed as substitute for a traditional overlay target 310 when diagonal (45 degree) wires are implemented in a circuit design.

Figure 4:
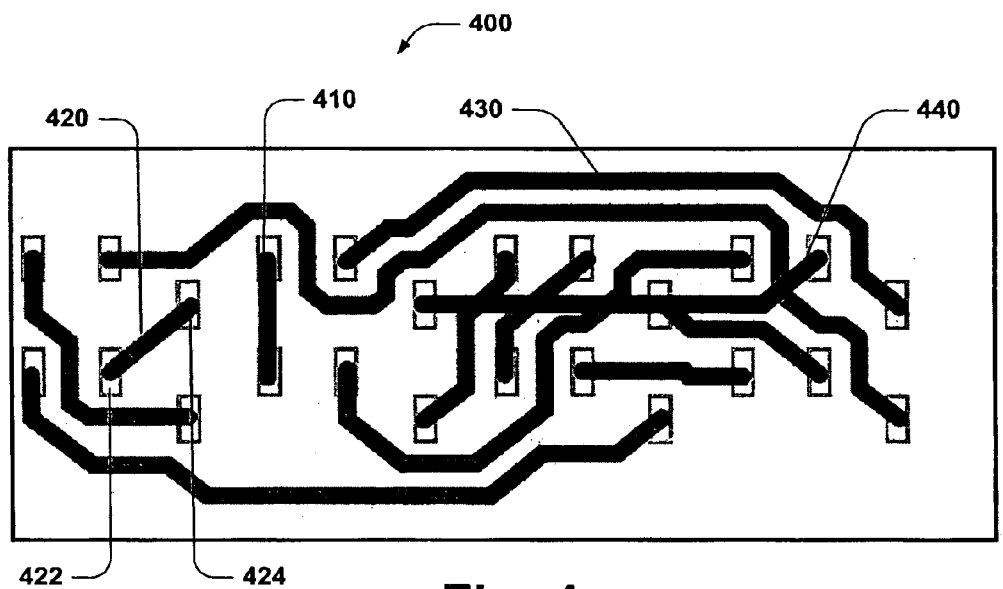
FIG. 4 illustrates a circuit design employing X-initiative's pervasive use of diagonal (45 degree) wiring.

FIG. 4 illustrates a circuit design 400 which employs X architecture to follow design methods of the X-Initiative. X-initiative designs utilize connections provided by traditional orthogonal wires 410 as well as connections made via wires placed diagonal 420 (45 degrees) to the traditional wires to connect points 522 and 524.

It is to be appreciated that the diagonal wires are not a traditional orthogonal layout turned 45 degrees from normal. Rather, the X-initiative diagonal routing allows for points to be connected via a mixture of orthogonal and diagonal (45 degree) wires. Implementing a circuit design that utilizes both traditional and orthogonal wiring is called "liquid routing." In particular, liquid routing allows the most efficient use of wire length, power consumption and/or circuit size by allowing a circuit designer to determine a "best route" to make connection from point-to-point. Therefore, the use of diagonal (45 degree) wires in a circuit do not have the same limitations as a traditional circuit design may have.

In this particular embodiment, the circuit design 400 employs two levels of wiring to provide for connectivity to substantially all points in the chip. A first level employs a wire 430 to provide connectivity between two points. Wire 430 is comprised of both diagonal 432 and traditional (orthogonal) 434 wiring. The layout of exemplary wire 430 provides for a shorter wire length than would be employed utilizing a traditional design. Similarly, a second level employs a wire 440 to connect two points. The wire 440 layout follows the principles of liquid routing by employing both diagonal and orthogonal paths.

Figure 5:
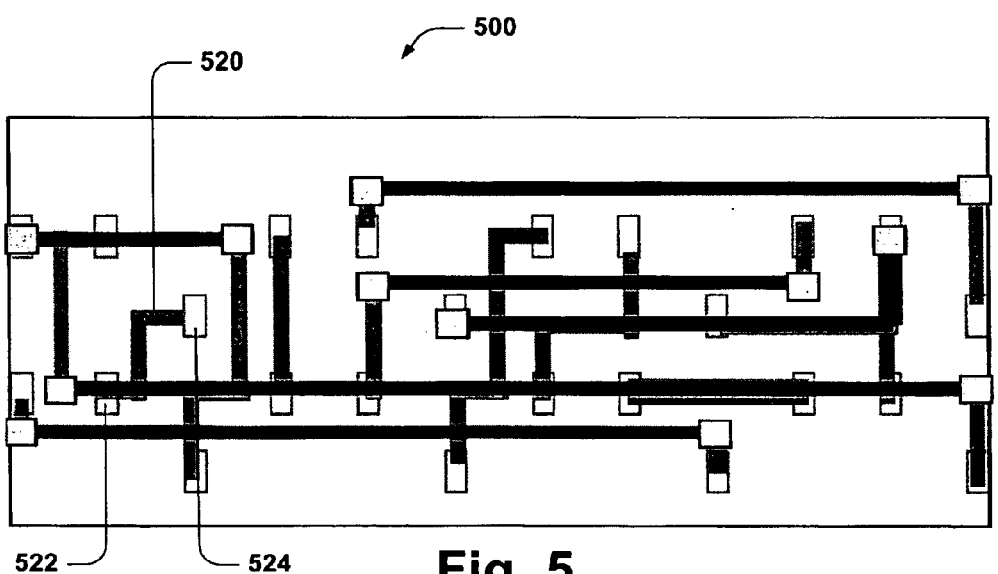
FIG. 5 illustrates prior art showing a traditional circuit design employing strictly horizontal and perpendicular wiring.

Turning now to FIG. 5, which illustrates a circuit 500 that represents substantially the same circuit as 400 with the same connectivity requirements. However, circuit 500 differs from circuit 400 in that the wire routing follows the design restrictions inherent in a traditional (orthogonal) wire layout. For comparison, the same points connected in circuit 400 are shown connected in circuit 500 utilizing a traditional wire layout. In particular, connecting point 522 to point 524 is accomplished by implementing wire 520 which runs in a horizontal and vertical direction following a traditional design methodology. In comparison, a single wire that is run diagonal to provide a connection between two points 422 and 424 accomplishes connecting points 422 to point 424 in circuit 400. It is to be understood that the remaining connections in circuit 500 utilize a traditional layout to provide connectivity between points.

Figure 6:
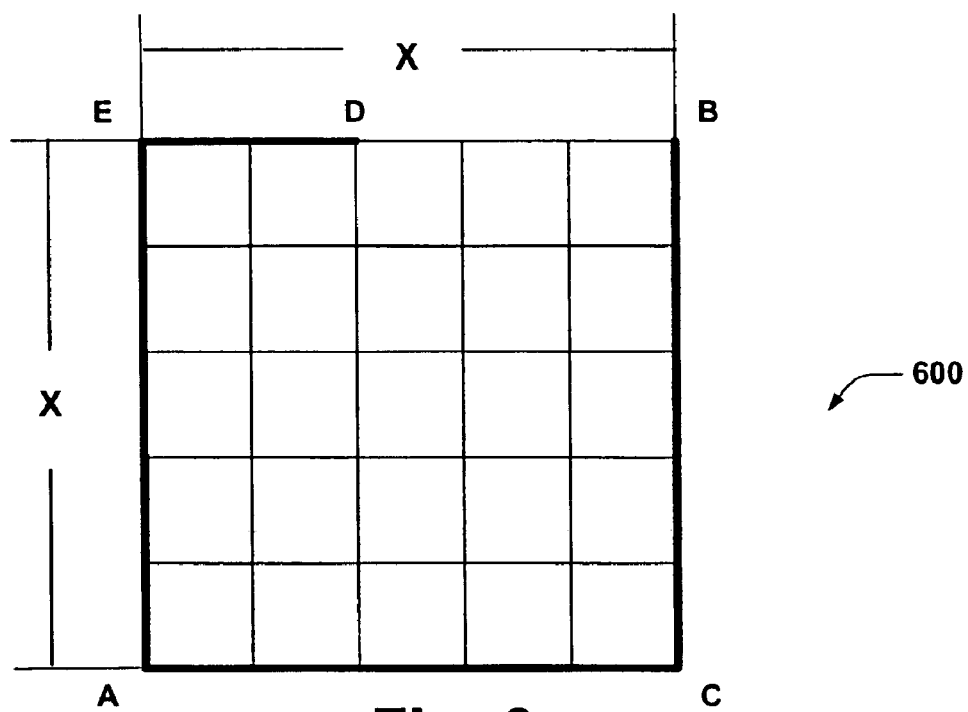
FIG. 6 illustrates a traditional wiring architecture to connect two or more points.
Figure 7:
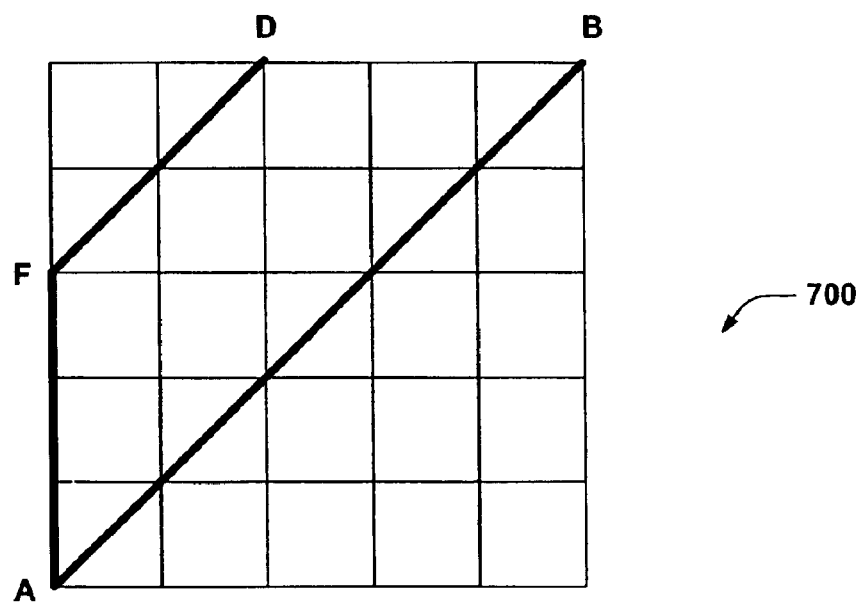
FIG. 7 illustrates a diagonal (45 degree) wiring architecture employing the X-initiative to connect two or more points.

Turning now to FIGS. 6 and 7, which illustrates wire lengths for connecting between points AB and AD and employing a traditional (orthogonal) architecture 600 and an X-architecture 700. The dimension "X" in each figure is one unit of length and therefore each block in 600 and 700 represents 0.2 units of length.

Layout 600 illustrates connecting two points AB and AD utilizing a traditional (orthogonal) circuit architecture. In order to connect point A to point D with the shortest wire length routing is provided first from point A to point E then from point E to point D. The length of wire AE is 1 unit and the length of wire ED is 0.4 units. Therefore, the total wire length to connect point A to point D is 1.4 units utilizing a traditional (orthogonal) architecture.

In contrast, employing an X-architecture 700, points A and D can be connected via a diagonal wire, which creates a shorter path than 600 to connect points A and D. First, a wire is utilized to connect point A and F which is 0.6 units long. Next, point F is connected to point D utilizing a diagonal wire path. The length of the diagonal path can be calculated as:

$$FD=\sqrt{0.4^2+0.4^2}=0.57 \text{ units}$$

Combining the two lengths provides:

$$AD=AF+FD=0.6+0.57=1.17 \text{ units}$$

Comparing the two wire lengths AD utilizing a traditional and X-architecture provides:

Traditional—$AD=AE+ED=1.0+0.4=1.4$ units

X-architecture—$AD=AF+FD=0.6+0.57=1.17$ units

Determining the reduction in wire length for this particular example:

1.40 units−1.17 units=0.23 units 0.23 units/1.40 units=a 17% reduction in wire length utilizing X-architecture instead of a traditional architecture.

Similarly, the difference in wire length can be calculated for wire AB in both 600 and 700. Architecture 600 provides for connecting points AC and CB to facilitate connecting points A and B. Segment AC and CB are each 1.0 unit in length providing a 2.0 unit length to connect points A and B. In contrast, architecture 700 provides a single wire employed to connect points A and B.

Comparing the two wire lengths AB utilizing a traditional and X-architecture provides:

Traditional—$AB=AC+CB=1.0+1.0=2.0$ units

X-architecture—$AB=\sqrt{1.0^2+1.0^2}=\sqrt{2}=1.4$ units

Determining the reduction in wire length for this particular example:

2.0 units−1.4 units=0.6 units 0.6 units/2.0 units=a 30% reduction in wire length utilizing X-architecture instead of a traditional architecture.

Thus, as shown by the two above architectures 600 and 700, wire lengths can be shortened under the X-initiative to provide connections between points in a circuit. The maximum reduction in wire length to connect two points utilizing an X-architecture is 30 percent as demonstrated by the second example. This reduction can occur, for instance, when a single diagonal wire to connect two points can replace two orthogonal wires of equal length.

Figure 8:
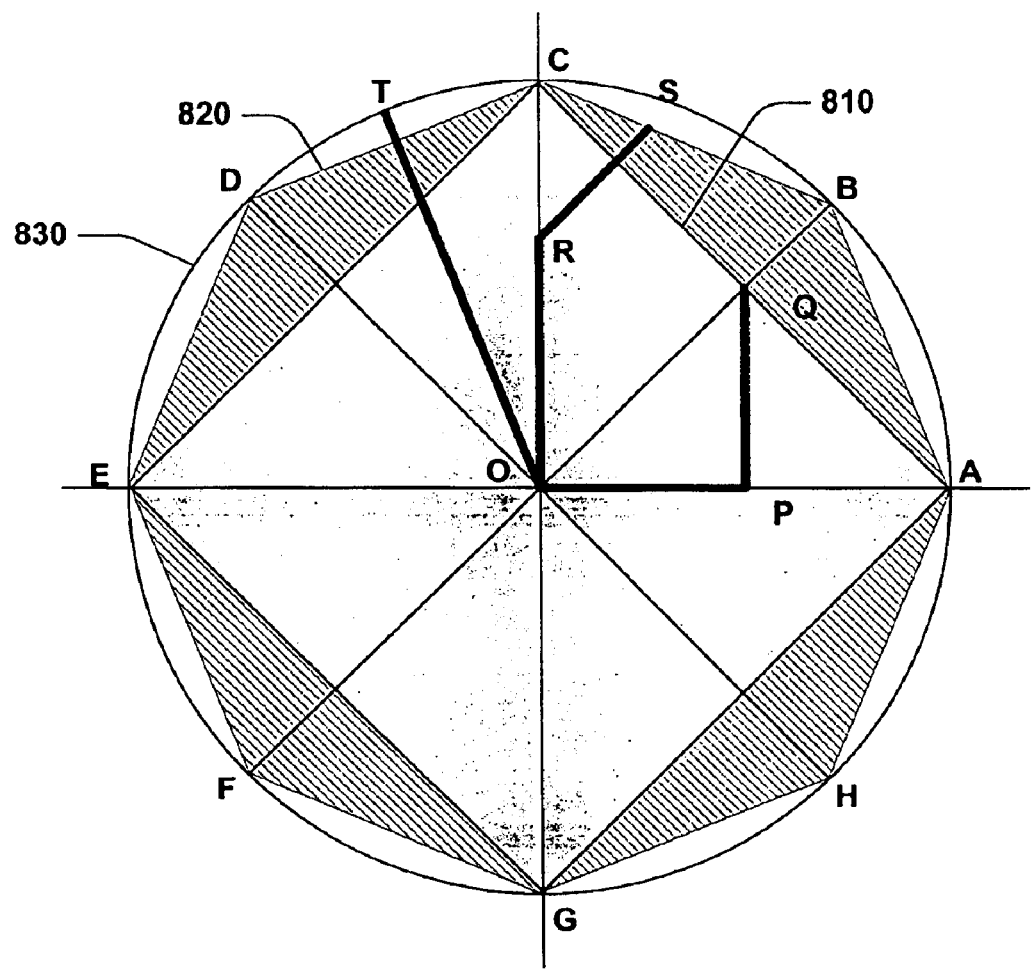
FIG. 8 illustrates a comparison of wire lengths utilizing traditional versus X-initiative design methods.

Turning now to FIG. 8 which shows the routable area of a routing resource of 1 unit in length from point O utilizing a traditional architecture 810 (rhombus ACEG), and an X-architecture 820 (octagon ABCDEFG) and an architecture which is completely flexible 830 (circle OA). As the size of the components decrease in semiconductor circuit designs, the resistance increases in proportion the proximity of each component to one another. However, as the component size decreases, the routing capacitance does not decrease accordingly and signal delay caused by interconnect increases with each generation chips containing smaller and smaller components. Therefore, the performance of a chip depends increasingly on its wiring. X-Architecture can be implemented to help mitigate the timing convergence problem associated with increasingly smaller component sizes. This is because the chip area covered by any particular routing network is larger with X Architecture than in the case of traditional routing. Thus, the larger the routable area, the better the timing driven layout function.

FIG. 8 shows the routable area from point O with a unit length of wire for different architectures. The traditional (orthogonal) architecture covers the area denoted by the rhombus ACEG (e.g., from O to Q via P would require a one unit length of wire), while in an architecture where the routing direction is completely flexible, one can reach any point on the circle of radius 1 drawn around O. In the X Architecture, apart from the horizontal and perpendicular directions, routing in 45 degrees and 135 degrees directions is permissible. The octagon ABCDEFGH therefore, denotes the routable area with a unit length of wire. (e.g., the distance from point O to point S via R is 1.)

As one can see from FIG. 8, assuming the area that is routable using a traditional architecture with particular length of wire is 1 unit, the routable areas for an X architecture and a completely flexible architecture can be calculated:

Traditional architecture:

$$AREA_{ACEG}/2=(\sqrt{2}*\sqrt{2})/2=2/2=1 \text{ unit}$$

X architecture:

$$AREA_{ABCDEFG}/2=((4*(\sqrt{2}/2))*(1-\sqrt{2}/2)+2)/2=(2\sqrt{2}-2+2)/2=\sqrt{2}=1.41 \text{ units}$$

Completely flexible architecture:

$$AREA_{OA}/2=\pi r^2/2=\pi(1)^2/2=\pi/2=1.57 \text{ units}$$

Thus, as shown above the X architecture provides a greater area of coverage utilizing the same routing length as a traditional architecture. It is to be appreciated that the completely flexible architecture is shown by way of illustration and not limitation to demonstrate a possible next generation of circuit design.

Metrology can also be accomplished by employing a critical dimension scanning electron microscope (CD-SEM). A CD-SEM provides for a measurement taken from the top of the target down (e.g. normal to the surface of measurement). This limitation can prevent a desired dimension from being measured correctly because the feature is at an angle that prevents an accurate measurement.

Figure 9:
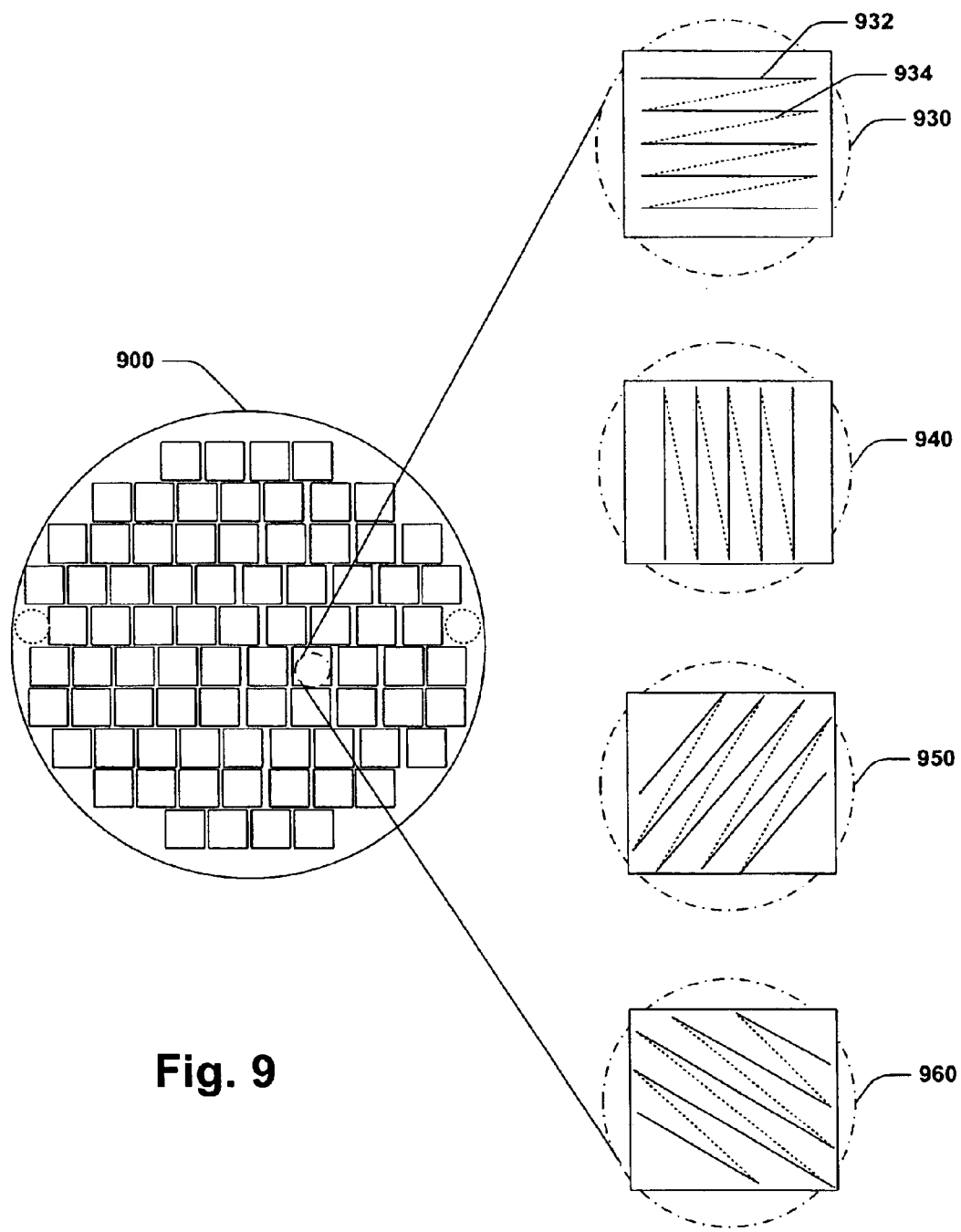
FIG. 9 illustrates a CD-SEM inspection system that employs diagonal (45 degree) inspection in order to provide for a proper inspection of a surface.
Figure 10:
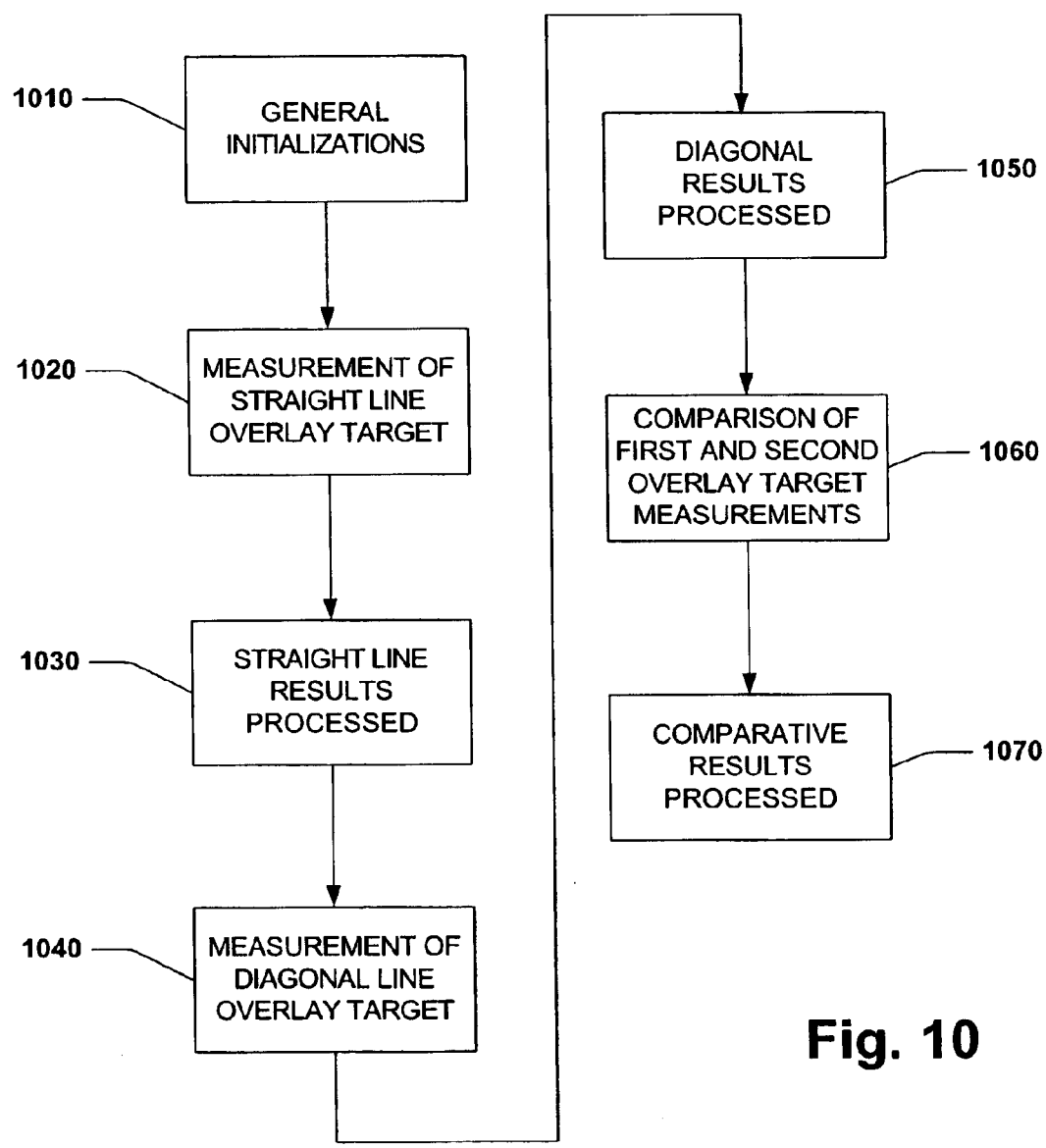
FIG. 10 illustrates a methodology utilized to measure an overlay target utilizing diagonal (45 degree) lines of inspection.
Figure 11:
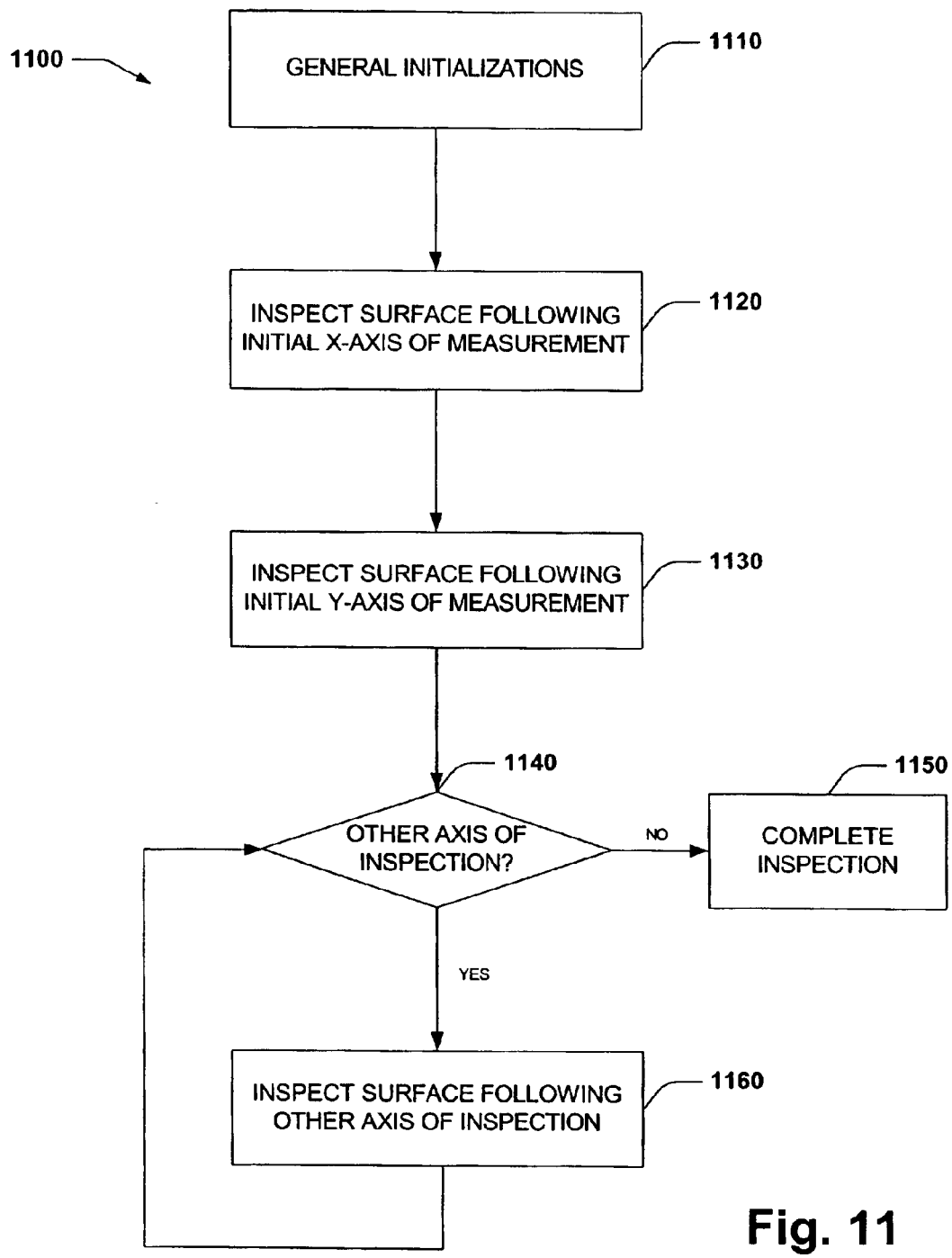
FIG. 11 illustrates an inspection methodology to be utilized with a CD-SEM that provides for inspection along diagonal lines of inspection.

FIGS. 9, 10 and 11 illustrate methodologies in accordance with the present invention. For simplicity of explanation, the methodologies are depicted and described as a series of acts. It is to be understood and appreciated that the present invention is not limited by the acts illustrated and/or by the order of acts, for example acts can occur in various orders and/or concurrently, and with other acts not presented and described herein. Furthermore, not all illustrated acts may be required to implement a methodology in accordance with the present invention. In addition, those skilled in the art will understand and appreciate that a methodology could alternatively be represented as a series of interrelated states (e.g., state diagram) or events.

FIG. 9 illustrates a system and methodology for inspection of a wafer 900 utilizing a CD-SEM implementing first a straight-line inspection 930–940 followed by an inspection that follows diagonal (45 degree) lines 950–960. In this particular embodiment, a step-by-step methodology is shown to illustrate the steps of inspection that take place. First, the CD-SEM is employed to inspect the surface of the wafer at substantially 0 degrees 930 relative to the surface of the wafer. The angle at which the CD-SEM inspects the surface is determined by the position of the wafer relative to the CD-SEM.

A line 932 representing a given axis denotes an inspection line. After each line is inspected utilizing the CD-SEM, the CD-SEM inspects the next line following substantially the path of the line 934. It is to be understood that after each line of inspection is complete, the line of inspection adjacent to the last inspected will be followed. Further, a plurality of lines of inspection can be utilized to provide for an increased resolution of the inspection of the surface of a wafer or other substrate.

After the wafer has been inspected in substantially a zero degree axis, the wafer is inspected at 940 by the CD-SEM by following a path substantially 90 degrees relative to the original path of inspection. For example, if the original axis of inspection is substantially 2 degrees, the second axis of inspection will be substantially 92 degrees. The second path of inspection can be determined manipulating the wafer relative to the CD-SEM. Alternatively, the CD-SEM can be rotated to provide for a substantially 90 degree line of inspection relative to the original (first) axis of inspection.

Afterward, a plurality of diagonal (45 degree) inspection lines 950–960 can be followed in order to provide for axes of inspection in a plurality of angles relative to the original straight lines of inspection. The surface features desired to be inspection can dictate the diagonal lines of inspection since employing traditional straight-line inspection methods may not provide for desired inspection results.

In this particular embodiment, a single axis of inspection is employed to provide for a path of inspection on a wafer surface. It is to be appreciated that a plurality of diagonal lines of inspection can be followed in order to accommodate the inspection of a desired feature. The line of inspection can be selected by a user to accommodate inspection of a multitude of features inspected from a plurality of angles.

FIG. 10 illustrates a methodology utilized to provide for inspection of an overlay metrology target such as, for example, the overlay target 430. At 1010, general system initializations are employed to allow for including but not limited to locating a reference location to be utilized as a datum for the coordinate system. After the system has finished all initialization procedures, the measurement of the "straight line" overlay target is performed at 1020 by employing the use of a CCD camera or some such device for example. The measurements taken are then processed at 1030 utilizing an algorithm employed to determine the center point of both the inner and outer-segmented frame boxes in both the horizontal and vertical directions.

Afterward, at 1040, the diagonal (45 degree) lines are utilized to provide for an alternate line of inspection around substantially the same centerpoint as in 1020. It is to be appreciated that the diagonal lines may be provided from a plurality of directions and/or angles (e.g. 45, 135, 225 and 315 degrees). Further, at 1050, the plurality of disparate diagonal lines will be inspected until such time that substantially all are processed.

The results obtained from the straight line at 1030 and diagonal line of inspection at 1050 are then compared at 1060 to determine if the overlay metrology of the target is within the tolerance allowed for fabrication. An algorithm is utilized to determine if the results obtained from the straight-line measurement and the diagonal line measurement fall within tolerances set for a fabrication at 1070.

FIG. 11 illustrates a methodology 1100 utilized to facilitate the inspection of a wafer surface such as for example, employing the use of a CD-SEM. At 1110 initialization of the inspection system is which can include for example locating a reference location to be utilized as a datum for the coordinate system. Afterward, the inspection system is employed to top-down inspect the surface under examination in substantially an X-axis of measurement 1120. An X-axis of measurement relates to a line of inspection that is substantially 0 degrees in relation to a horizontal datum on a surface such as a semiconductor wafer. It is to be understood that facilitation of the inspection along a substantially X-axis can be accomplished by moving the inspection system (e.g. CD-SEM) along a static surface, and/or moving a surface relative to the inspection system.

Inspection of the surface along a Y-axis 1130 is performed in substantially the same manner as stage 1120 wherein the Y-axis line of inspection is approximately orthogonal to the X-axis line of inspection. Inspection is performed along the Y-axis line of inspection wherein data is collected at about the same time as the inspection is performed.

Once the Y-axis inspection stage 1130 is complete, it is determined if there are other lines of inspection 1140 along which to examine a surface. The CD-SEM can have with it a processor and memory to facilitate the determination whether another line of inspection is necessary. If the determination is made that no other line of inspection is necessary, the CD-SEM will complete the inspection 1150 and provide a means to signal the termination of the inspection.

However, if the determination is made that another axis of inspection is necessary, the CD-SEM will follow a diagonal path to perform subsequent inspections 1160. For example, if an X architecture is employed, inspection will be performed to ensure that the components and wires are located within a fabrication tolerance. The alternate lines of inspection will be followed and inspections performed until there are no longer lines of inspection necessary to follow.

It is to be understood that stages 1120, 1130 and 1140 can be performed in substantially any order in order to facilitate a proper examination of the surface under inspection. For example, if inspection would begin with a diagonal line providing more accurate results, that stage can be implemented first before the inspection is performed in either the X or Y-axis.

Figure 12:
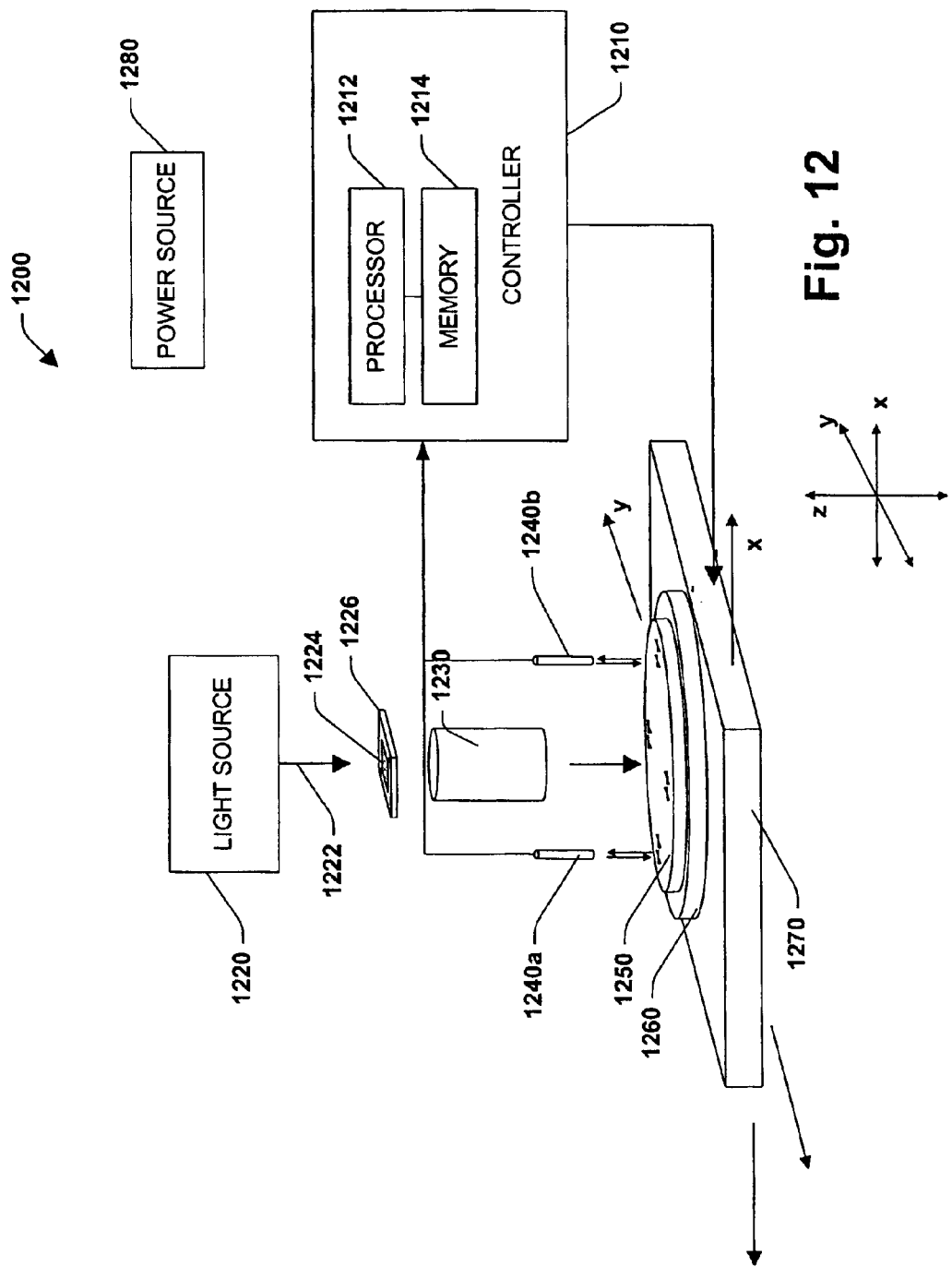
FIG. 12 is a representative schematic illustration of a wafer alignment system in accordance with the present invention.

FIG. 12 is a representative system 1200 for wafer alignment in accordance with the present invention. The system 1200 includes a reticle 1226 with a design pattern 1224. A light source 1220 projects light 1222 through the reticle 1226 to so as to project the design pattern 1224 onto a wafer 1250. The light 1222 from the light source 1220 passes through the reticle 1226 and through the optical axis of a projection lens system 1230. The projection lens system 1230 projects the design pattern 1224 of the reticle 1226 onto the wafer 1250 while in most cases substantially reducing the imaged design pattern. It is to be appreciated that reflection-type systems, scanning systems and other suitable systems may be employed in carrying out the present invention.

A wafer holder 1260 vacuum-adsorbs the wafer 1250 and is provided for slight rotation relative to a stage 1270 two-dimensionally moveable in an x-direction and y-direction. The stage 1270 and wafer holder 1260 are controlled by a controller 1210. The controller 1210 effects rotation of the wafer holder 1260 and movement of the stage 1270 (via a plurality of motors (not shown)) for wafer alignment and positioning. The controller 1210 includes a processor 1212 which is programmed to control and operate the various components within the system 1200 in order to carry out the various functions described herein. The manner in which the processor 1212 can be programmed to carry out the functions relating to the present invention will be readily apparent to those having ordinary skill in the art based on the description provided herein.

A memory 1214 which is operatively coupled to the processor 1212 is also included in the controller 1210 and serves to store program code executed by the processor 1212 for carrying out operating functions of the system 1200 as described herein. The memory 1214 includes, for example, read only memory (ROM) and random access memory (RAM). The RAM is the main memory into which the operating system and application programs are loaded. The memory 1214 also serves as a storage medium for temporarily storing information such as reticle position, wafer position, reticle coordinate tables, wafer coordinate tables, alignment mark information, printed alignment mark information, virtual alignment mark information, programs for determining virtual alignment mark locations and other data which may be employed in carrying out the present invention. For mass data storage, the memory 1214 may also include a hard disk drive (e.g., 50 Gigabyte hard drive).

A power source 1280 provides operating power to the system 1200. Any suitable power source (e.g., battery, line power) may be employed to implement the present invention.

In one specific case, the system 1200 further includes off-axis type wafer alignment microscopes 1240*a* and 1240*b* (collectively referred to by reference number 1240). The microscopes 1240 have optic axes parallel to the optic axis of the projection system 1230 and image on the wafer 1250 band-like laser light spots (not shown), for example. The band-like laser spots are light of a wavelength which does not activate the photosensitive agent (photoresist) on the wafer 1250. Each microscope 1240 has a photo-element (not shown) receiving scattered light and diffracted light from the alignment marks printed on the wafer surface (photoresist). The microscopes 1240 also include systems for synchronizing and rectifying the photoeletric signal output by the photo-elements, respectively, at the vibration period of the light spot(s) and output an alignment signal corresponding to alignment mark deviation relative to the center of vibration of the light spot(s). It is to be appreciated that the wafer alignment mark positioning systems are evolving rapidly and any suitable positioning system (e.g., through the lens system) may be employed to carry out the present invention and is intended to fall within the scope of the hereto-appended claims.

Wafer alignment systems are well known in the art, and therefore it is to be appreciated that conventional aspects of the system 1200 are described herein at a high level or omitted for sake of brevity. One skilled in the art could readily construct a wafer alignment system in accordance with the present invention based on the teachings herein.

Figure 13:
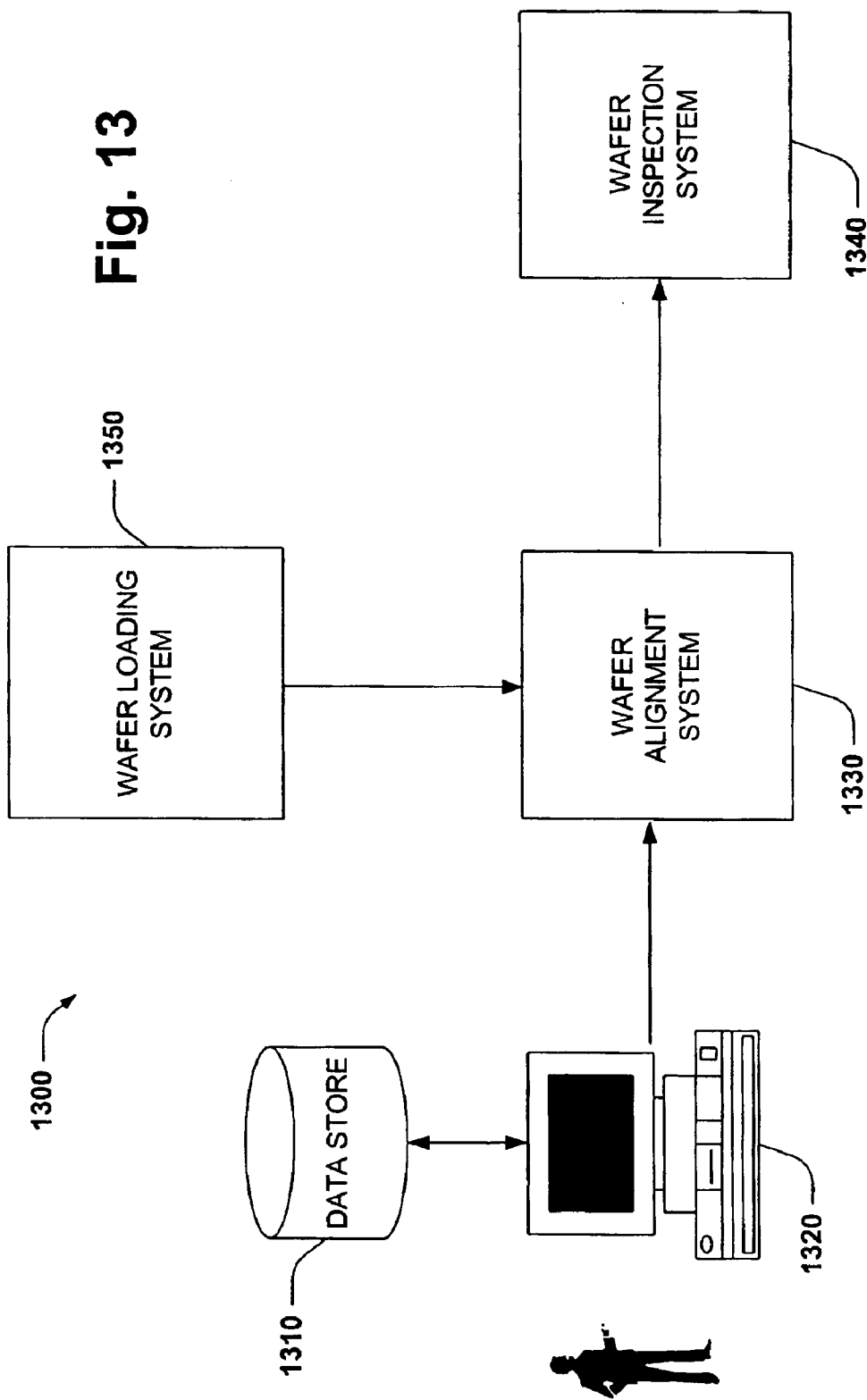
FIG. 13 illustrates a wafer alignment system in an exemplary operating environment.

FIG. 13 illustrates an exemplary system 1300 wherein a wafer inspection system and wafer alignment system can reside. It is to be appreciated that the system may include a system that utilizes an overlay target(s) employed to provide overlay alignment (not shown). Furthermore, the system as shown can contain a plurality of systems (not shown) employed to provide quality control during manufacturing.

A user interface 1320 can be utilized to enter a plurality of attributes associated with alignment marks placed on a reticle and/or a wafer. The 1320 can be a graphical user interface (GUI) or a command line interface, for example. The GUI can comprise known text and/or graphic presenting regions comprising dialogue boxes, static controls, drop-down-menus, list boxes, pop-up menus, and graphic boxes. The presenting regions can further include utilities to facilitate the presentation. For example, the presenting regions can include vertical and/or horizontal scroll bars to facilitate navigation through the foregoing and toolbar buttons to determine whether a region will be viewable. The user interface can interact with the presenting regions to select and provide information via various devices such as a mouse, a roller ball, a keypad, a keyboard, a pen and/or voice activation, for example.

Input regions utilized to obtain information can employ similar mechanism (e.g., dialogue boxes, etc.), and in addition provide utilities such as edit controls, combo boxes, radio buttons, check boxes, and push buttons, wherein the GUI can use the various input devices (e.g., the mouse, the roller ball, the keypad, the keyboard, the pen and/or voice activation) in connection with the mechanism and utilities. Typically, a mechanism such as a push button is employed subsequent entering the information in order to initiate conveyance of the information. However, it is to be appreciated that the invention is not so limited. For example, merely highlighting the check box can initiate information conveyance.

A data store 1310 can be accessed to allow historical data to be served up and compared to known present data relating to semiconductor manufacturing. The data store 1310 allows for a more efficient system since the parameters utilized for wafer alignment, wafer inspections, etc. does not have to be determined every time a new fabrication is implemented. For example, if a semiconductor fabrication requires a minimum tolerance, the data store 1310 can be accessed to facilitate a best means to meet the desired tolerance.

A wafer loading system 1350 is employed to locate and position a wafer in relation to a wafer alignment system 1330. The wafer loading system can be a device that allows a user to load parts or alternatively to have the parts loaded automatically into a desired location to facilitate a best alignment between a reticle and wafer.

Once the wafer has been properly loaded, the alignment system 1330 is utilized to provide a means to align a reticle and wafer by creating alignment marks and adding lines to intersect with the alignment marks. The number and size of the added lines can be determined based on a user's accuracy requirements. For example, if a certain standard deviation is required in a process (e.g. chip manufacturing), that standard deviation can correspond to an intersection size to facilitate reticle and wafer alignment.

A wafer inspection system 1340 (as shown) is employed after the wafer has been properly aligned and the semiconductor manufacturing process is complete. It is to be appreciated, however, that the inspection system can be employed throughout the manufacturing process and not necessarily after manufacturing is complete. A wafer inspection system utilized in semiconductor manufacturing can be, for example a critical dimension scanning electron microscope (CD-SEM).

Figure 14:
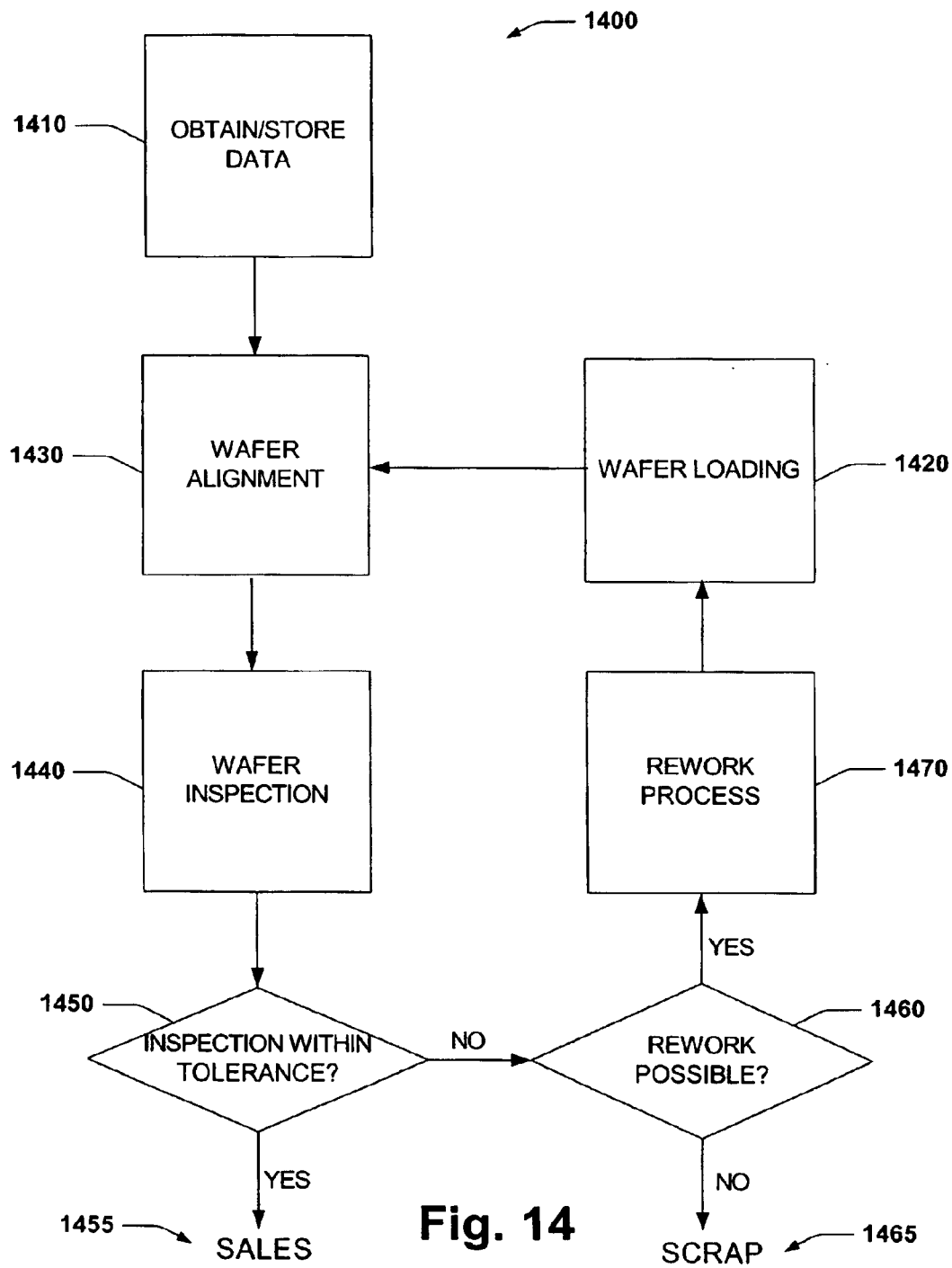
FIG. 14 illustrates a methodology employing wafer alignment in relation to other exemplary processes.

FIG. 14 shows a methodology utilized to provide a wafer alignment and inspection to fabricate wafers in a production setting. A user interface at 1410 can be utilized to obtain/store a plurality of attributes associated with alignment marks placed on a reticle and/or a wafer. The 1410 can be a graphical user interface (GUI) or a command line interface, for example. The GUI can comprise known text and/or graphic presenting regions comprising dialogue boxes, static controls, drop-down-menus, list boxes, pop-up menus, and graphic boxes. The presenting regions can further include utilities to facilitate the presentation. For example, the presenting regions can include vertical and/or horizontal scroll bars to facilitate navigation through the foregoing and toolbar buttons to determine whether a region will be viewable. The user interface can interact with the presenting regions to select and provide information via various devices such as a mouse, a roller ball, a keypad, a keyboard, a pen and/or voice activation, for example.

Input regions utilized to obtain information can employ similar mechanism (e.g., dialogue boxes, etc.), and in addition provide utilities such as edit controls, combo boxes, radio buttons, check boxes, and push buttons, wherein the GUI can use the various input devices (e.g., the mouse, the roller ball, the keypad, the keyboard, the pen and/or voice activation) in connection with the mechanism and utilities. Typically, a mechanism such as a push button is employed subsequent entering the information in order to initiate conveyance of the information. However, it is to be appreciated that the invention is not so limited. For example, merely highlighting the check box can initiate information conveyance.

A data store can be accessed to allow historical data to be served up and compared to known present data relating to semiconductor manufacturing. The data store allows for a more efficient system since the parameters utilized for wafer alignment, wafer inspections, etc. does not have to be determined every time a new fabrication is implemented. For example, if a semiconductor fabrication requires a minimum tolerance, the data store can be accessed to facilitate a best means to meet the desired tolerance.

At 1420, wafer loading is employed to locate and position a wafer in relation to a wafer alignment 1430. The wafer loading 1420 can be a device that allows a user to load parts or alternatively to have the parts loaded automatically into a desired location to facilitate a best alignment between a reticle and wafer.

Once the wafer has been properly loaded, the wafer alignment 1430 is utilized to provide a means to align a reticle and wafer by creating alignment marks and adding lines to intersect with the alignment marks. The number and size of the added lines car be determined based on a user's accuracy requirements. For example, if a certain standard deviation is required in a process (e.g. chip manufacturing), that standard deviation can correspond to an intersection size to facilitate reticle and wafer alignment.

A wafer inspection 1440 is employed after the wafer has been properly aligned and the semiconductor manufacturing process is complete. It is to be appreciated, however, that the inspection system can be employed throughout the manufacturing process and not necessarily after manufacturing is complete. A wafer inspection system utilized in semiconductor manufacturing can be, for example a critical dimension scanning electron microscope (CD-SEM).

At 1450, a decision is made based on data received from the wafer inspection to determine if the wafer fabrication is within a desired tolerance. If the wafer is within a desired tolerance, the wafer will be sent on to a sales channel 1455 to distribute to a customer. If the wafer inspection 1440 finds that the fabrication is not within a desired tolerance, a determination is made if a wafer can be reworked 1460 to be utilized in a new fabrication process. If the wafer cannot be reworked, it is sent to a scrap operation 1465. However, if a determination is made that the wafer can be reworked and employed in a new fabrication, the wafer is sent to a rework process 1470 to prepare the wafer for a new fabrication. After the rework process 1470 is complete, the wafer is loaded 1480 into a wafer alignment at 1430.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for aligning a wafer to a reticle, comprising:
   the reticle, including:
      a design area;
      a first alignment mark; and
      a second alignment mark which is symmetric to the first alignment mark with respect to a reticle centerpoint;

at least one additional diagonal line intersecting at least one alignment mark utilized to facilitate a more accurate alignment of components and wires in accordance with the X initiative.

2. The system of claim 1, further comprising a processor which allows a user to select and place at least one additional diagonal line to intersect at least one alignment mark.

3. The system of claim 1, the diagonal line is one of 45, 135, 225 and 315 degrees relative to first and second alignment marks, wherein an alignment mark comprises two lines which intersect and are orthogonal.

4. The system of claim 1 further comprising a memory operatively coupled to the processor to facilitate adding additional lines based on prior operations.

5. The system of claim 1, the processor determines the number of additional lines required to achieve a desired accuracy within an alignment mark.

6. A wafer alignment system employing the system of claim 1.

7. A wafer fabrication system employing the system of claim 1.

8. A system for aligning two or more wafer layers, comprising:
   a reticle, including:
      a design area;
      a first overlay target; and
      a second overlay target which is symmetric to the first overlay target with respect to a reticle centerpoint;
   at least one additional diagonal line segment utilized to facilitate a more accurate overlay; and
   a processor which allows a user to select and place at least one additional diagonal line segment.

9. The system of claim 8 wherein a diagonal line is a line that is at least one of 45, 135, 225 or 315 degrees relative to an alignment mark comprising two lines which intersect and are orthogonal.

10. The system of claim 8 further comprising a memory operatively coupled to the processor to facilitate adding additional lines based on prior operations.

11. The system of claim 8 wherein the processor determines the number of additional lines required achieving a desired accuracy within an overlay target.

12. A wafer overlay alignment system employing the system of claim 7.

13. A wafer fabrication system employing the system of claim 7.

14. A method for facilitating wafer alignment comprising the steps of:
   using a reticle, including:
      a design area;
      a first alignment mark;
      a second alignment mark which is symmetric to the first alignment mark
      with respect to a reticle centerpoint; and
   adding at least one additional diagonal fine intersecting at least one alignment mark utilized to facilitate a more accurate alignment.

15. A method for facilitating wafer alignment, comprising the steps of:
   using a retiole, including:
      a design area;
      a first overlay target; and
      a second overlay target which is symmetric to the first overlay target with respect to a reticle centerpoint;
   adding at least one additional diagonal line segment utilized to facilitate a more accurate overlay; and
   selecting and placing at least one additional diagonal line segment utilizing a processor.

16. A method of aligning a wafer and measuring overlay error, the method comprising:
   means for adding at least one additional diagonal line to an alignment mark to facilitate more accurate wafer alignment;
   means for adding at least one additional diagonal line segment to facilitate a more accurate overlay; and
   means for selecting and placing at least one additional diagonal line to intersect at least one alignment mark utilizing a processor.

17. The system of claim 1, further including surface inspection equipment, comprising:
   at least one CD-SEM;
   a scanning apparatus facilitating the inspection of the surface at at least one of 0, 45, 90, 135, 180, 225, 270, 315 or 360 degrees;
   a processor; and
   a wafer surface that includes at least one feature.

18. A wafer inspection system employing the system of claim 17.

19. A wafer fabrication system employing the system of 17.

20. The system of claim 17, the surface is comprised of a semiconductor material.

21. The system of claim 17, the processor utilized to determine a best angle or angles to inspect a surface feature.

22. The system of claim 17, further comprising a receiving element operatively coupled to the CD-SEM.

23. The method of claim 14, further comprising selecting and placing at least one additional diagonal line to intersect at least one alignment mark utilizing a processor.

24. The method of claim 23, wherein the diagonal line comprises at least one of 0, 45, 90, 135, 180, 225, 270, 315 and 360 degrees relative to the alignment mark.

25. The method of claim 15, facilitating surface inspection utilizing surface inspection equipment, comprising:
   employing at least one CD-SEM;
   locating surface features to be measured;
   scanning the inspection surface at at least one of 0, 45, 90, 135, 180, 225, 270, 315 or 360 degrees; and
   processing information to determine a best angle or angles to inspect a surface feature.

* * * * *